US006788231B1

(12) United States Patent
Hsueh

(10) Patent No.: US 6,788,231 B1
(45) Date of Patent: Sep. 7, 2004

(54) DATA DRIVER

(75) Inventor: Wei-Chieh Hsueh, Tainan (TW)

(73) Assignee: Toppoly Optoelectronics Corporation, Chu-Nan (TW)

( * ) Notice: Subject to any disclaimer, the term of this patent is extended or adjusted under 35 U.S.C. 154(b) by 0 days.

(21) Appl. No.: 10/459,479

(22) Filed: Jun. 12, 2003

(30) Foreign Application Priority Data

Feb. 21, 2003 (TW) ........................................ 92103685 A

(51) Int. Cl.[7] .............................................. H03M 1/00
(52) U.S. Cl. ...................................... 341/135; 341/144
(58) Field of Search ................................. 341/135, 144, 341/150, 136

(56) References Cited

U.S. PATENT DOCUMENTS

| | | | | |
|---|---|---|---|---|
| 4,384,274 A | * | 5/1983 | Mao | 341/135 |
| 4,594,577 A | * | 6/1986 | Mao | 341/135 |
| 5,903,246 A | * | 5/1999 | Dingwall | 345/82 |
| 6,018,269 A | * | 1/2000 | Viswanathan | 330/254 |
| 6,154,160 A | * | 11/2000 | Meyer et al. | 341/139 |
| 6,166,670 A | * | 12/2000 | O'Shaughnessy | 341/136 |
| 6,538,591 B2 | * | 3/2003 | Sato et al. | 341/155 |
| 6,608,577 B2 | * | 8/2003 | Nishimura | 341/144 |

OTHER PUBLICATIONS

Article entitled 16–1: A Poly–Si TFT 6–bit Current Data Driver for Active Matrix Organic Light Emitting Diode Displays by K. Abe, et al. pages 279–282, published in EURODISPLAY 2002.
Article entitled 36.4L: Late–News Paper:4.0–in. TFT–OLED Displays and a Novel Digital Driving Method by Kazutaka Inukai et al., pp. 924–927, published in SID 00 DIGEST, publication ISSN0000–0966X100/ 3101–0924–$1.00+.00 copyright. 2000 SID.
Article entitled Data–Line Driver Circuits for Current–Programmed Active–Matrix OLED Based on poly–Si TFTs by reiji Hattori, pp. 17–20, publication No. AM–LCD '02.
24.4L: Late–News Paper: Article entitled A 13.0–inch AM–OLED Display with Top Emitting Structures and Adaptive Current Mode Programmed Pixel Circuit (TAC) by Tatsuya Sasaoka et al., published in SID 01 DIGEST, No. ISSN/0001–0966X/01/3201–0348–$1.00+.00 copyright 2001 SID, pages 384–387.
Article entitled Active Matrix Addressing of Polymer Light Emitting Diodes Using Low Temperature Poly Silicon TFTs by I.M. Hunter and N.D. Young, publication AM–LCD 2000, pp. 249–252.
Article entitled Analog–Circuit Simulation of the Current- –Programmed Active–Matrix Pixel Electrode Circuits Based on Poly–Si TFT for Organic Light–Emitting Displays by Hattori et al. published in AM–LCD '01, pp. 223–226.
Article entitled "A Novel Pixel Design For An Active Matrix Organic Light Emitting Diode Display" by Sung Joon Bae et al. publication No. ISSN1083–1312/00/ 2001–0358–$1.00+.00 copyright 2000 SID, pp. 358–361.
Article entitled "The Impact of the Transient Response of Organic Light Emitting dioes on the Design of Active Matrix OLED Displays" by R.M.A. Dawson et al. publication No. 0–7803–4774–9/98/$10.00 copyright 1998 IEEE, pp. 32.6.1–32.6.4.
Article entitled "Low–Temperature Poly–Si TFT Driven Light–Emitting–Polymer Displays and Digital Gray Scale for Uniformith by M. Kimura, et al. pp. 171–174, publication IDW"99.

* cited by examiner

Primary Examiner—Peguy JeanPierre
(74) Attorney, Agent, or Firm—Michael D. Bednarek; Shaw Pittman LLP

(57) ABSTRACT

A data driver for driving pixels in an active matrix organic LED (AMOLED) is provided the data driver includes a plurality of converters configured to convert to analog current signal digital voltage signals in order to drive the pixels to emit light. Each converter has a plurality of current mirror devices configured to generate mirrored current signals by inputting two control signals. Meanwhile, the mirrored current signals can maintain their preciseness even if deviation of the characteristics of the transistors implanted within the current mirror devices occurs during fabricating.

15 Claims, 5 Drawing Sheets

DATA DRIVER

This Application claims priority to Taiwan Patent Application No. 092103685 filed on Feb. 21, 2003.

FIELD OF INVENTION

The present invention relates to a data driver for an active matrix organic light emitting display (AMOLED), which is configured to convert digital voltage signals into analog current signals to drive pixels in the display to emit light.

BACKGROUND OF THE INVENTION

Pixels in an AMOLED are driven by analog current signals; however, the signals that control the pixels to emit light are digital voltage signals. Therefore, each AMOLED needs a data driver (or source driver) to convert digital control voltage signals into analog current signals.

FIG. 1 illustrates a data driver 1 of the prior art. As it shows, the data driver 1 includes a first shift register 101, a data register 103, a voltage latch 105, a converter 107, a current latch 109, a current source 111, and a second shift register 113. The converter 107 is configured to receive the digital voltage signals 110, which will later drive pixels to emit light, from the voltage latch 105, and to convert the digital voltage signals 110 into analog current signals 112 based on the reference currents provided by the current source 111. The second shift register 113 is configured to switch on or off each cell in the current latch 109 in order to store the analog current signals 112 sent by the converter 107. After a proper period of time, an enabling signal 108 enables the current latch 109 so that all the analog current signals 114, identical to the analog current signals 112, are able to reach all pixels of the AMOLED to present a transient frame.

The framework of the converter 107 is basically a current mirror. FIG. 2 illustrates one kind of current mirror of the prior art. With reference to FIG. 2, a reference current $I_s$, generated by the current source 111 shown in FIG. 1, mirrors $I_{p1}, I_{p2}, I_{p3}$, etc. through a transistor MP1. It is noted that the values of the mirrored currents, e.g. $I_{p1}, I_{p2}, I_{p3}$, etc., are associated with the characteristics, i.e. aspect ratio, threshold voltage, and mobility, of MP2, MP3, MP4, etc. Once any deviation from the theoretical characteristics of the transistors is induced during fabricating, the practical values of the mirrored current $I_{p1}, I_{p2}, I_{p3}$ etc. will bring error as well. The error, even if it is tiny, might still influence the gray level that an analog current signal actually sets in due to the narrow band of each gray level and, therefore, pixels might emit unexpected illumination.

SUMMARY OF THE INVENTION

The present invention discloses a data driver for an active matrix organic light emitting display (AMOLED), which converts digital voltage signals into analog current signals in order to drive all pixels in the display to emit light.

The data driver includes a first shift register, a data register, a data latch, a second shift register, and N converters The first shift register is configured to provide an N-bit first control signal The data register is configured to store N M-bit digital voltage signals by switching on the cells in it in turn in response to the first control signal, and to send the N digital voltage signals to the data latch. The data latch is configured to receive the N digital voltage signals and respectively transmit them to the N converters in response to an enabling signal. The second shift register is configured to provide an (M+1)-bit second control signal to control the procedure of converting the digital voltage signals into analog current signals.

Each converter of the data driver of the present invention is a digital-voltage-to-analog-current converter with M units regarded as current sources. Each current source (or each unit) includes two control signals to enable or disable the transistors within so as to control the generation timing of mirrored currents. The current source can overcome the drawbacks of the prior art and, therefore, the mirrored current does not deviate even if the characteristics of the transistors within have been changed during fabricating.

DETAILED DESCRIPTION

Figure 1:
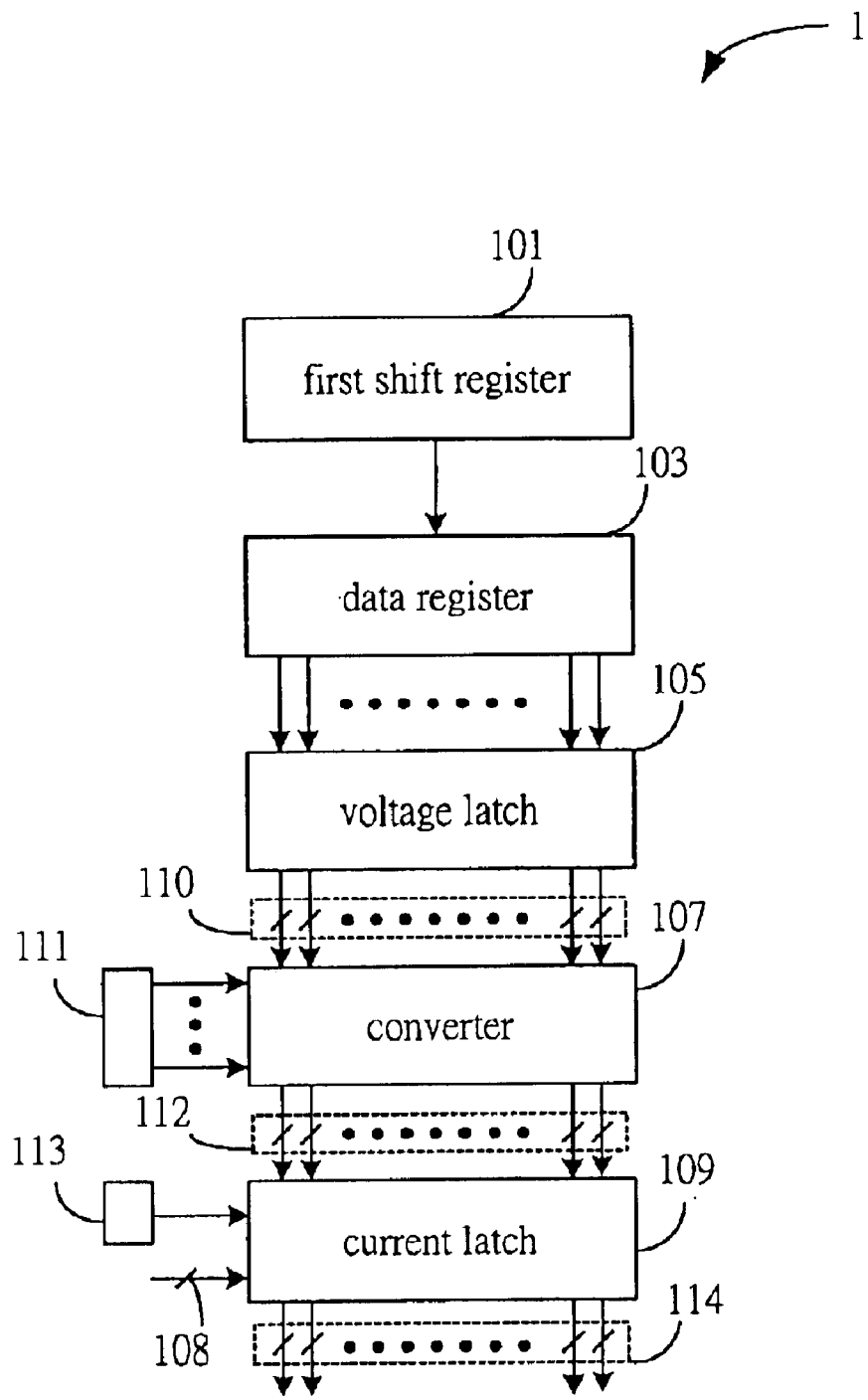
FIG. 1 illustrates a data driver of the prior art.
Figure 2:
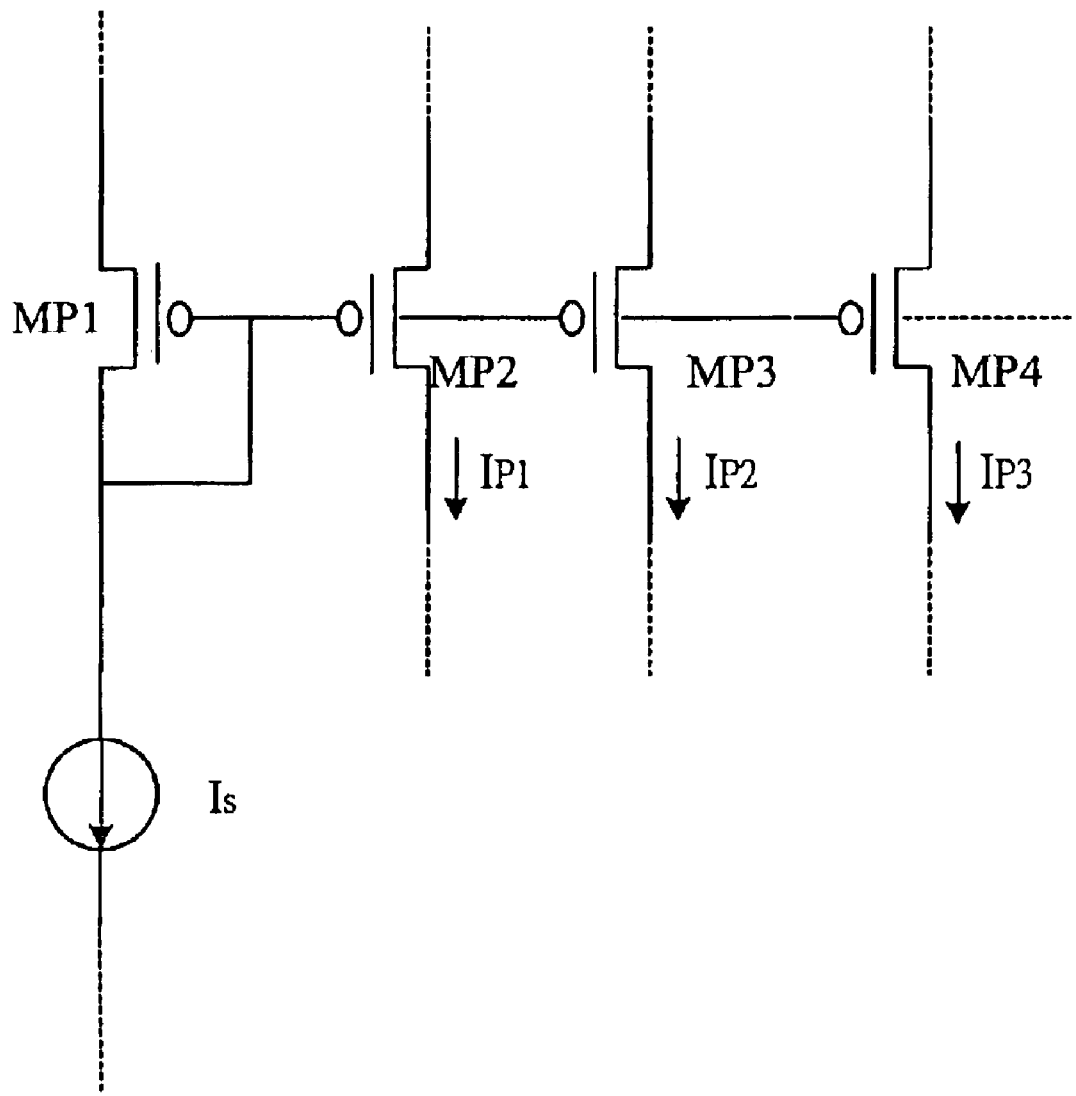
FIG. 2 is the exemplary circuitry of a current mirror of the prior art.
Figure 3:
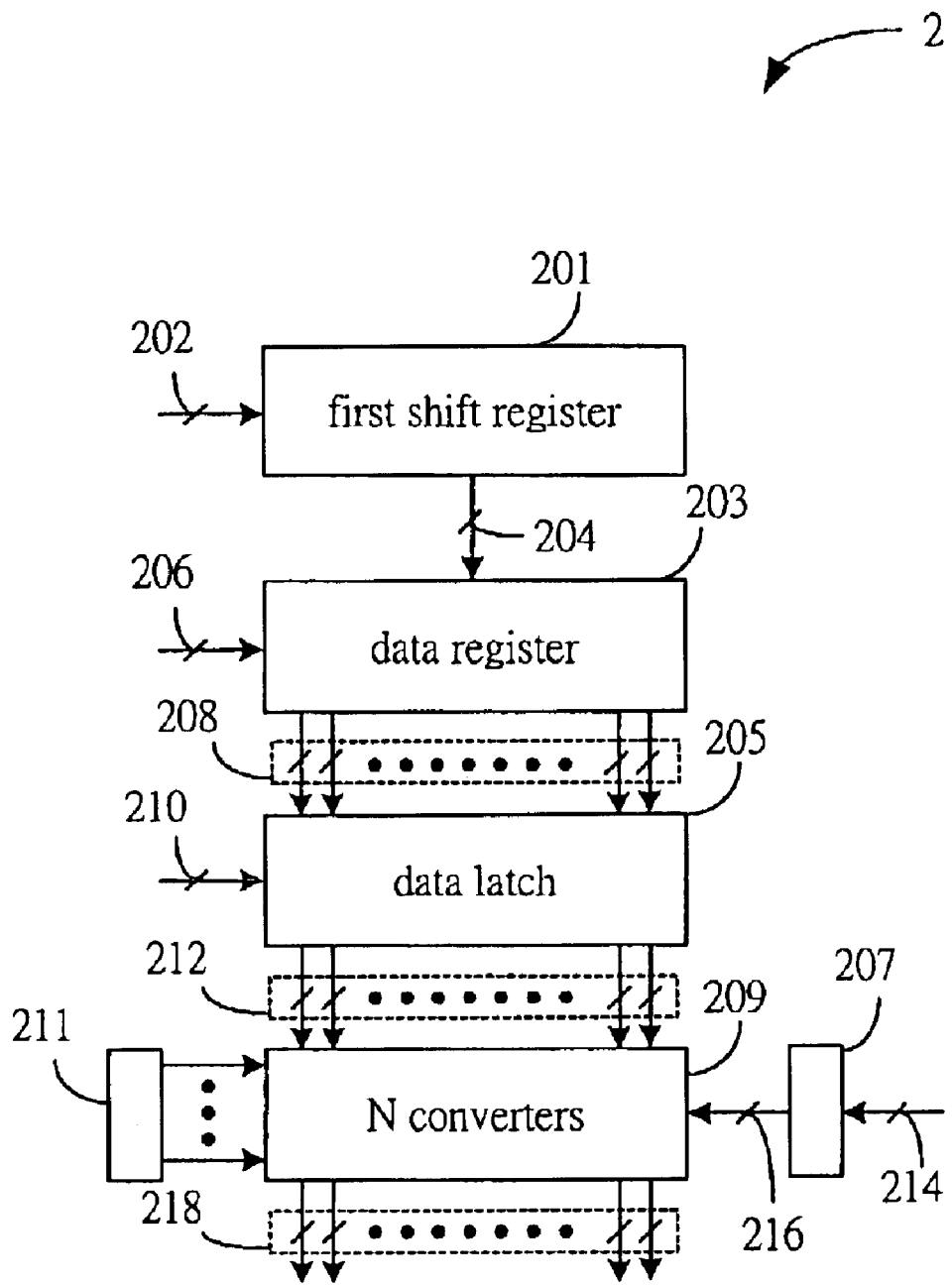
FIG. 3 illustrates the data driver of the present invention.

With reference to FIG. 3, the data driver 2 disclosed by the present invention includes a first shift register 201, a data register 203, a data latch 205, a second shift register 207, and N converters 209. The first shift register 201 is configured to receive a data shift signal 202 and provide an N-bit first control signal 204. The first control signal 204 is transmitted to the data register 203 to switch on the cells in the data register 203 so that N M-bit digital voltage signals 206 are stored in turn. The digital voltage signals 206 are the signals that need to be converted into analog current signals 218, which are then respectively transmitted through data lines to drive pixels and make pixels emit light. After receiving and storing all of the digital voltage signals 206, the data register 203 will send these signals 206 to the data latch 205. The data latch 205 is switched on by an enabling signal 210 at a particular timing so that the digital voltage signals 208, identical to the digital voltage signals 206, are able to be transmitted to N converters 209 respectively. The second shift register 207 is configured to provide an (M+1)-bit second control signal 216 in response to a signal 214 to activate the procedure of converting digital voltage signals 212, identical to the digital voltage signals 208, to analog current signals 218 in N converters 209. The converters 209 are digital-voltage-to-analog-current converters with the same function that the current latch 109 shown in FIG. 1 has. Each of the converters 209 is capable of seizing the converted analog current signals 218 and does not release them to pixels until all of the digital voltage signals 212 have been converted.

Figure 4:
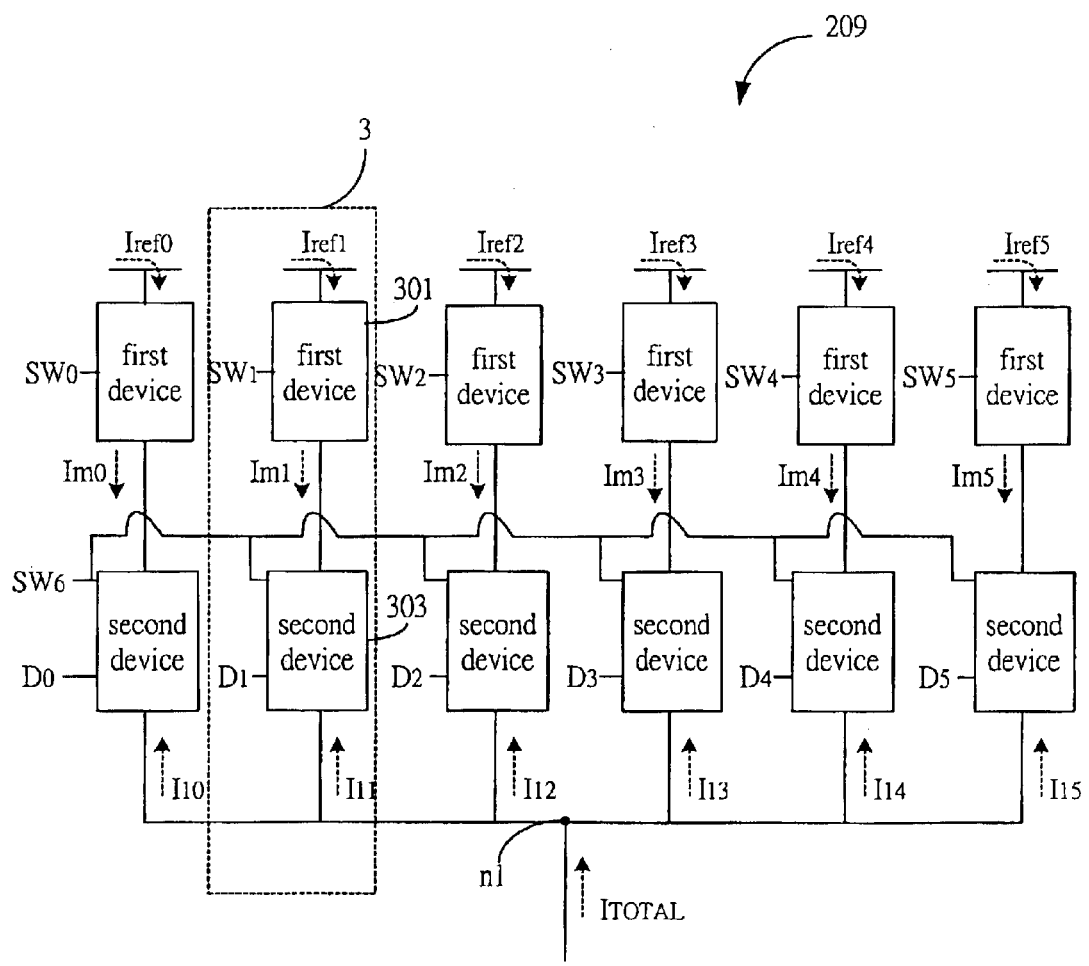
FIG. 4 illustrates the converter of the present invention.

To specify one preferred embodiment of the converters 209 of the present invention, each digital voltage signal is assumed to be a 6-bit signal. As shown in FIG. 4, each of the N converters 209, responsive to a 6-bit input, is required to have 6 first devices 301 and 6 second devices 303. Each first device 301, responsive to one of the preceding 6 bits $SW_0$~$SW_5$ of the second control signal 216, is configured to generate one of the 6 first mirrored currents $I_{m0}$~$I_{m5}$ respectively, and to transmit it to the corresponding second device 303. Each second device 303, responsive to both a last bit $SW_6$ of the second control signal 216 and one of the 6 first mirrored currents $I_{m0}$~$I_{m5}$, is configured to generate one of the 6 second mirrored currents $I_{10}$~$I_{15}$. Finally, the specific digital voltage signal 212 is converted into an analog current signal 218 when all of the 6 second mirrored currents $I_{10} \sim I_{15}$ are added together.

Take the unit 3 shown in FIG. 4 as an example, the first device 301 converts the reference current $I_{ref1}$ provided by the current source 211 into a first mirrored current $I_{m1}$ after receiving the second bit $SW_1$ of the second control signal 216. The second device 303 then converts the first mirrored current $I_{m1}$, into a second mirrored current $I_{11}$ according to the value of the second bit $D_1$ of the specific digital voltage signal 206 while receiving the last bit $SW_6$ of the second control signal 216.

The current source 211 of the embodiment has at least 6 outputs so that it provides 6 different reference currents $I_{ref0} \sim I_{ref5}$ for the 6 first devices 301 to respectively generate the 6 first mirrored currents $I_{m0} \sim I_{m5}$. The value of each 6 referent currents $I_{ref0} \sim I_{ref5}$ is 2 times larger than that of each preceding one. If $I_{ref0} = 2$ μA, for example, then $I_{ref1} = 4$μA, $I_{ref2} = 8$ μA, $I_{ref3} = 16$ μA, $I_{ref4} = 32$ μA, and $I_{ref5} = 64$ μA. Assuming that one of the digital voltage signals is $(D_5 D_4 D_3 D_2 D_1 D_0) = (101001)$, the corresponding analog current signal $I_{TOTAL}$ generated by the converter 209, as shown in FIG. 4, will equal $Im0 + I_{m3} + I_{m5} = I_{ref0} + I_{ref3} + I_{ref5} = 82$ μA.

Figure 5:
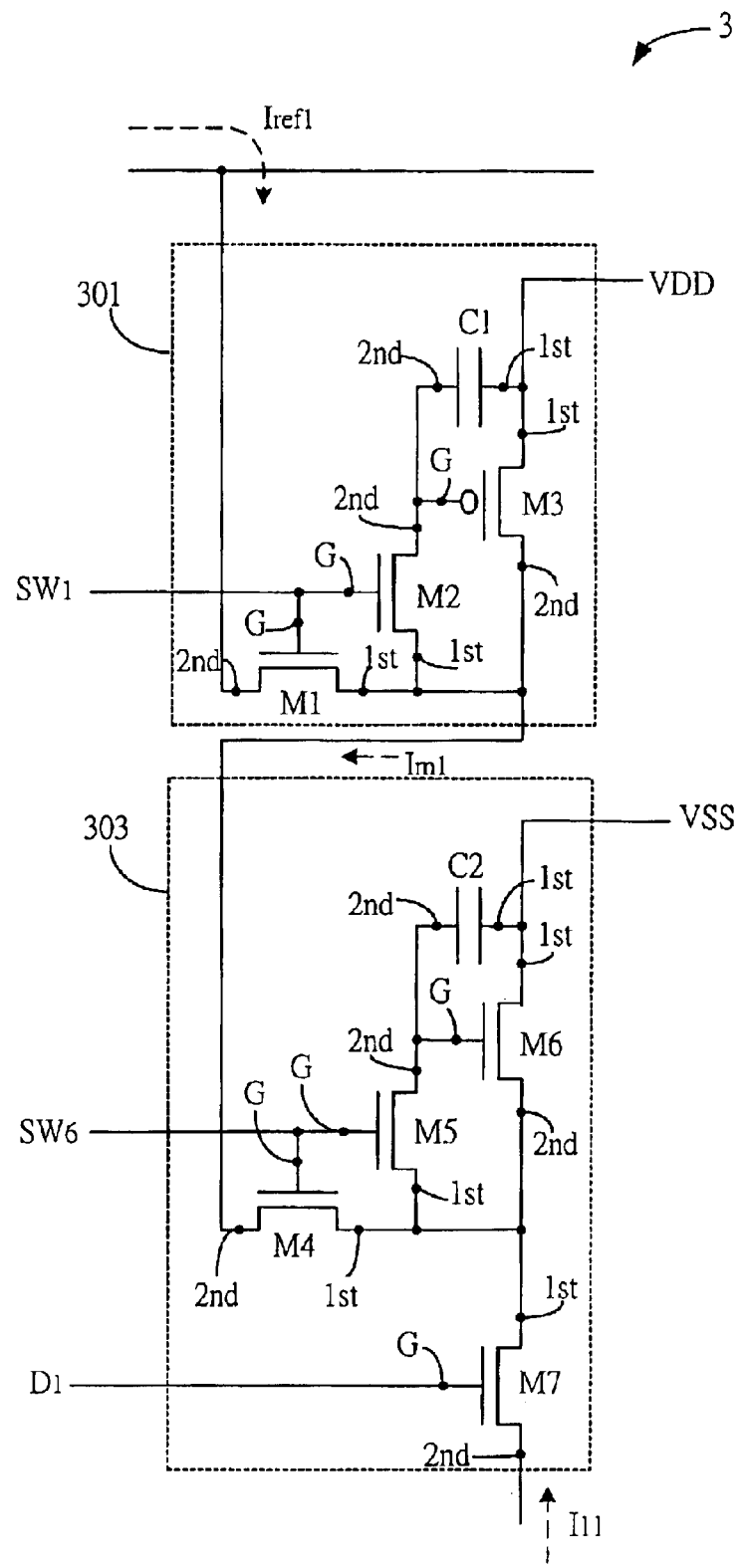
FIG. 5 is the circuitry of a current mirror of the present invention.

FIG. 5 illustrates the circuitry of the unit 3 shown in FIG. 4. The converter 209 can provide a high level voltage source VDD and a low level voltage source VSS externally or internally. The first device 301 includes a first transistor M1, a second transistor M2, a third transistor M3, and a first capacitor C1. The first transistor M1 and the second transistor M2 are n-channel TFTs, and the third transistor M3 is a p-channel TFT. All of the transistors M1, M2, and M3 include a source, a drain, and a gate respectively. Since there is no difference between the source and the drain of a TFT, both are renamed as a first terminal and a second terminal in the following description to avoid misunderstanding. The first capacitor C1 includes a first end 1st and a second end 2nd. The interconnections within the first device 301 include: the gate G of the first transistor M1 is configured to input the second bit $SW_1$, of the second control signal 216, the second terminal 2nd of the first transistor M1 is connected to the second output $I_{ref1}$ of the current source 211, the first terminal 1st of the first transistor M1 is respectively connected to the first terminal 1st of the second transistor M2 and the second terminal 2nd of the third transistor M3, the gate G of the second transistor M2 is connected to the gate G of the first transistor M1, the second terminal 2nd of the second transistor M2 is respectively connected to the gate G of the third transistor M3 and the second end 2nd of the first capacitor C1, and the first end 1st of the first capacitor C1 is respectively connected to the first terminal 1st of the third transistor M3 and the high level voltage source VDD.

The second device 303 includes a fourth transistor M4, a fifth transistor M5, a sixth transistor M6, a seventh transistor M7, and a second capacitor C2. The transistors M4~M7 are all n-channel TFTs having a first terminal 1st, a second terminal 2nd, and a gate G. The second capacitor C2 includes a first end 1st and a second end 2nd. The interconnections within the second device 303 include: the gate G of the fourth transistor M4 is configured to input the last bit $SW_6$ of the second control signal 216, the second terminal 2nd of the fourth transistor M4 is connected to the second terminal 2nd of the third transistor M3 of the first device 301, the first terminal 1st of the fourth transistor M4 is respectively connected to the first terminal 1st of the fifth transistor M5 and the second terminal 2nd of the sixth transistor M6, the gate G of the fifth transistor M5 is connected to the gate G of the fourth transistor M4, the second terminal 2nd of the fifth transistor M5 is respectively connected to the gate G of the sixth transistor M6 and the second end 2nd of the second capacitor C2, the first end 1st of the second capacitor C2 is respectively connected to the first terminal 1st of the sixth transistor M6 and the low level voltage source VSS, the first terminal 1st of the seventh transistor M7 is connected to the second terminal 2nd of the sixth transistor M6, and the gate G of the seventh transistor M7 is configured to input the second bit $D_1$ of the 6-bit digital voltage signal 212.

The second bit $SW_1$, of the second control signal 216 is used to enable or disable the first transistor M1 and the second transistor M2. When $SW_1$, is high, the first transistor M1 and the second transistor M2 are enabled so that the second reference current $I_{ref1}$ provided by the current source 211 is able to flow through the first transistor M1 and the third transistor M3 and hence charge the first capacitor C1. In other words, the second reference current $I_{ref1}$ is converted into a corresponding first voltage stored in the first capacitor C1. After the first capacitor C1 is fully charged, $SW_1$ will switch to a low level so that the first transistor M1 and the second transistor M2 are disabled and, therefore, the first voltage is saved in the first capacitor C1.

The last bit $SW_6$ of the second control signal 216 is used to enable or disable the fourth transistor M4 and the fifth transistor M5. When $SW_6$ is high, the fourth transistor M4 and the fifth transistor M5 are enabled so that the first voltage stored in the first capacitor C1 is able to convert into a second voltage stored in the second capacitor C2. After the second capacitor C2 is fully charged, $SW_6$ switches to a low level to disable the fourth transistor M4 and the fifth transistor M5 and, therefore, the second voltage is saved in the second capacitor C2. If the second bit $D_1$ of the digital voltage signal 212 transmitted to the converter 209 shown in FIG. 4 is high, the second voltage will be converted into the second mirrored current $I_{11}$ flowing through the sixth transistor M6 and the seventh transistor M7. Otherwise, the transistor M7 will be off and the second mirrored current $I_{11}$ will not appear.

The equation showing the relation of the current and the potential difference between the gate and the source of a field effect transistor (FET) in a saturation region is $$i_D = \frac{1}{2}\mu C_{OX} \frac{W}{L}(v_{GS} - V_t)^2$$

According to this equation, when the first capacitor C1 is in charging mode, the second reference current $I_{ref1}$ can be converted into a corresponding $V_{GS}$ stored in the first capacitor C1 regardless of the practical aspect ratio, threshold voltage, or mobility of the third transistor M3. When $SW_6$ is high, the $V_{GS}$ stored in the first capacitor C1 is converted into the first mirrored current $I_{m1}$ to charge the second capacitor C2 through the transistors M3, M4, and M6. Because the $V_{GS}$ still biases on the third transistor M3, the value of the second mirrored current $I_{11}$ is substantially equal to that of the first mirrored current $I_{m1}$, i.e. equal to the reference current $I_{rf1}$.

Based on the aforementioned function of the unit 3, one can appreciate that the unit 3 is a current mirror. In this current mirror, $SW_1$ is regarded as a first control signal for enabling or disabling the first transistor M1 and the second transistor M2; $SW_1$ also assures that the reference current $I_{ref1}$ be converted into the first voltage stored in the first capacitor C1. Moreover, $SW_6$ is regarded as a second control signal for enabling or disabling the fourth transistor M4 and the fifth transistor M5; $SW_6$ assures that the first voltage be converted into the corresponding second voltage stored in the second capacitor C2. The second mirrored current $I_{11}$ is then generated in reference to the second voltage, i.e. in reference to the reference current $1_{ref1}$. The framework of the current mirror of the present invention has an advantage of generating a steady mirrored current without respect to the characteristics of the transistors within.

The frameworks and functions of other units shown in FIG. 4 are identical to those of the unit 3. As FIG. 4 shows, the second terminals of all the seventh transistors M7 of the second device 303 are respectively connected to a common node n1. A sum $I_{TOTAL}$ of all the currents flowing through the common node n1 is one of the analog current signals 218, which drives one pixel in an AMOLED to emit light. There are N converters 209 provided by the present invention to drive N pixels in an AMOLED to emit light simultaneously.

As forth above, the data driver of the present invention is capable of converting digital voltage control signals for controlling pixels to emit light into analog current signals that can drive OLEDs directly. Moreover, the data driver of the present invention is capable of generating steady analog current signals even if the characteristics of the transistors within deviate from theoretical values during fabricating.

What is claimed is:

1. A data driver of an active matrix organic light emitting display (AMOLED), comprising:
    a first shift register configured to provide an N-bit first control signal;
    a data register configured to store N M-bit digital voltage signals responsive to the first control signal;
    a data latch configured to receive and transmit the N digital voltage signals in response to an enabling signal;
    a second shift register configured to provide an (M+1)-bit second control signal; and
    N converters, each of the N converters comprising:
        M first devices, respectively responsive to preceding M bits of the second control signal, configured to generate M first mirrored currents respectively; and
        M second devices, responsive to a last bit of the second control signal and the M first mirrored currents, configured to convert one of the N digital voltage signals into an analog current signal.

2. The data driver of claim 1, wherein after the data latch receives all of the N digital voltage signals from the data register, the enabling signal enables the data latch in order to transmit the N digital voltage signals to the N converters respectively.

3. The data driver of claim 1, wherein the data driver further comprises a current source having at least M outputs for providing M different reference currents for the M first devices to generate the M first mirrored currents.

4. The data driver of claim 3, wherein each converter further comprises a high level voltage source and a low level voltage source, and each of the M first devices comprises:
    a first transistor, comprising a first terminal, a second terminal, and a gate;
    a second transistor, comprising a first terminal, a second terminal, and a gate;
    a third transistor, comprising a first terminal, a second terminal, and a gate; and
    a first capacitor, comprising a first end and a second end;
    wherein the gate of the first transistor is configured to input one of the preceding M bits of the second control signal, the second terminal of the first transistor is connected to one of the M outputs, the first terminal of the first transistor is respectively connected to the first terminal of the second transistor and the second terminal of the third transistor, the gate of the second transistor is connected to the gate of the first transistor, the second terminal of the second transistor is respectively connected to the gate of the third transistor and the second end of the first capacitor, and the first end of the first capacitor is respectively connected to the first terminal of the third transistor and the high level voltage source.

5. The data driver of claim 4, wherein each of the M second devices comprises:
    a fourth transistor, comprising a first terminal, a second terminal, and a gate;
    a fifth transistor, comprising a first terminal, a second terminal, and a gate;
    a sixth transistor, comprising a first terminal, a second terminal, and a gate;
    a seventh transistor, comprising a first terminal, a second terminal, and a gate; and
    a second capacitor, comprising a first end and a second end;
    wherein the gate of the fourth transistor is configured to input the last bit of the second control signal, the second terminal of the fourth transistor is connected to the second terminal of the third transistor, the first terminal of the fourth transistor is respectively connected to the first terminal of the fifth transistor and the second terminal of the sixth transistor, the gate of the fifth transistor is connected to the gate of the fourth transistor, the second terminal of the fifth transistor is respectively connected to the gate of the sixth transistor and the second end of the second capacitor, the first end of the second capacitor is respectively connected to the first terminal of the sixth transistor and the low level voltage source, the first terminal of the seventh transistor is connected to the second terminal of the sixth transistor, and the gate of the seventh transistor is configured to input one of the M bits of the digital voltage signal.

6. The data driver of claim 5, wherein the second terminal of the seventh transistor is respectively connected to a common node, and a sum of currents flowing through the common node is the analog current signal.

7. A digital-voltage-to-analog-current converter for converting an M-bit digital voltage signal into an analog current signal in response to a first control signal and a second control signal, the converter comprising:
    M first devices, responsive to the first control signal, configured to generate M first mirrored currents respectively; and
    M second devices, responsive to the second control signal and the M first mirrored currents, configured to convert the digital voltage signal into the analog current signal.

8. The digital-voltage-to-analog-current converter of claim 7, wherein the converter further comprises:
    a current source having at least M outputs for providing M different reference currents for the M first devices to generate the M first mirrored currents;
    a high level voltage source; and
    a low level voltage source.

9. The digital-voltage-to-analog-current converter of claim 8, wherein each of the M first devices comprises:

a first transistor, comprising a first terminal, a second terminal, and a gate;

a second transistor, comprising a first terminal, a second terminal, and a gate;

a third transistor, comprising a first terminal, a second terminal, and a gate; and a first capacitor, comprising a first end and a second end;

wherein the gate of the first transistor is configured to input the first control signal, the second terminal of the first transistor is connected to one of the M outputs, the first terminal of the first transistor is respectively connected to the first terminal of the second transistor and the second terminal of the third transistor, the gate of the second transistor is connected to the gate of the first transistor, the second terminal of the second transistor is respectively connected to the gate of the third transistor and the second end of the first capacitor, and the first end of the first capacitor is respectively connected to the first terminal of the third transistor and the high level voltage source.

10. The digital-voltage-to-analog-current converter of claim 9, wherein each of the M second devices comprises:

a fourth transistor, comprising a first terminal, a second terminal, and a gate;

a fifth transistor, comprising a first terminal, a second terminal, and a gate;

a sixth transistor, comprising a first terminal, a second terminal, and a gate;

a seventh transistor, comprising a first terminal, a second terminal, and a gate; and a second capacitor, comprising a first end and a second end;

wherein the gate of the fourth transistor is configured to input the second control signal, the second terminal of the fourth transistor is connected to the second terminal of the third transistor, the first terminal of the fourth transistor is respectively connected to the first terminal of the fifth transistor and the second terminal of the sixth transistor, the gate of the fifth transistor is connected to the gate of the fourth transistor, the second terminal of the fifth transistor is respectively connected to the gate of the sixth transistor and the second end of the second capacitor, the first end of the second capacitor is respectively connected to the first terminal of the sixth transistor and the low level voltage source, the first terminal of the seventh transistor is connected to the second terminal of the sixth transistor, and the gate of the seventh transistor is configured to input one of the M bits of the digital voltage signal.

11. The digital-voltage-to-analog-current converter of claim 10, wherein the second terminal of the seventh transistor is respectively connected to a common node, and a sum of currents flowing through the common node is the analog current signal.

12. A current mirror device, comprising:

a current source configured to provide a reference current;

a high level voltage source;

a low level voltage source;

a first control signal;

a second control signal;

a first transistor, comprising a first terminal, a second terminal, and a gate;

a second transistor, comprising a first terminal, a second terminal, and a gate;

a third transistor, comprising a first terminal, a second terminal, and a gate;

a fourth transistor, comprising a first terminal, a second terminal, and a gate;

a fifth transistor, comprising a first terminal, a second tennis, and a gate;

a sixth transistor, comprising a first terminal, a second terminal, and a gate;

a seventh transistor, comprising a first terminal, a second terminal, and a gate;

a first capacitor, comprising a first end and a second end; and a second capacitor, comprising a first end and a second end;

wherein the gate of the first transistor is configured to input the first control signal, the second terminal of the first transistor is connected to the current source, the first terminal of the first transistor is respectively connected to the first terminal of the second transistor and the second terminal of the third transistor, the gate of the second transistor is connected to the gate of the first transistor, the second terminal of the second transistor is respectively connected to the gate of the third transistor and the second end of the first capacitor, the first end of the first capacitor is respectively connected to the first terminal of the third transistor and the high level voltage source, the gate of the fourth transistor is configured to input the second control signal, the second terminal of the fourth transistor is connected to the second terminal of the third transistor, the first terminal of the fourth transistor is respectively connected to the first terminal of the fifth transistor and the second terminal of the sixth transistor, the gate of the fifth transistor is connected to the gate of the fourth transistor, the second terminal of the fifth transistor is respectively connected to the gate of the sixth transistor and the second end of the second capacitor, the first end of the second capacitor is respectively connected to the first terminal of the sixth transistor and the low level voltage source, and a current flowing through the sixth transistor is substantially equal to the reference current.

13. The current mirror device of claim 12, wherein the first control signal is to enable or disable the first transistor and the second transistor, and when the first transistor and the second transistor are enabled, the reference current, flowing through the third transistor, is converted to a first voltage stored in the first capacitor.

14. The current mirror device of claim 13, wherein the second control signal is to enable or disable the fourth transistor and the fifth transistor, and when the fourth transistor and the fifth or are enabled, the first voltage, via the sixth transistor, is converted to a second voltage stored in the second capacitor.

15. The current mirror device of claim 14, wherein when the fourth transistor and the fifth transistor are disabled, the second voltage is converted to the current flowing through the six transistor.

* * * * *